United States Patent
Osawa et al.

(10) Patent No.: US 9,577,457 B2
(45) Date of Patent: Feb. 21, 2017

(54) CONTROL DEVICE FOR SECONDARY BATTERY, CHARGING CONTROL METHOD, AND SOC DETECTION METHOD

(71) Applicant: NISSAN MOTOR CO., LTD., Yokohama-shi, Kanagawa (JP)

(72) Inventors: Yasuhiko Osawa, Yokosuka (JP); Tomohiro Kaburagi, Yokohama (JP); Atsushi Ito, Ebina (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 186 days.

(21) Appl. No.: 14/383,296

(22) PCT Filed: Feb. 26, 2013

(86) PCT No.: PCT/JP2013/054868
§ 371 (c)(1),
(2) Date: Sep. 5, 2014

(87) PCT Pub. No.: WO2013/133077
PCT Pub. Date: Sep. 12, 2013

(65) Prior Publication Data
US 2015/0028815 A1  Jan. 29, 2015

(30) Foreign Application Priority Data

Mar. 8, 2012  (JP) .................................. 2012-051168
Dec. 7, 2012  (JP) .................................. 2012-268038

(51) Int. Cl.
*H02J 7/00*  (2006.01)
*G01N 27/416*  (2006.01)
(Continued)

(52) U.S. Cl.
CPC ........... *H02J 7/007* (2013.01); *G01R 31/3606* (2013.01); *H01M 10/44* (2013.01); *H01M 10/48* (2013.01);
(Continued)

(58) Field of Classification Search
CPC ............................ H02J 7/007; G01R 31/3606
(Continued)

(56) References Cited

U.S. PATENT DOCUMENTS 5,561,362 A * 10/1996 Kawamura ........ G01R 31/3648
320/134
5,606,243 A *  2/1997 Sakai .................. B60L 11/1861
320/134
(Continued)

FOREIGN PATENT DOCUMENTS

JP    11-289685 A    10/1999
JP    2000-078757 A    3/2000
(Continued)

OTHER PUBLICATIONS

U.S. Appl. No. 14/383,249, filed Sep. 5, 2014, Nissan Motor Co., Ltd.
(Continued)

*Primary Examiner* — M'Baye Diao
(74) *Attorney, Agent, or Firm* — Foley & Lardner LLP

(57) ABSTRACT

The present invention provides a control device of a secondary battery. The control device of the secondary battery using, as a positive electrode material, a positive electrode active material that shows a difference of an open circuit voltage curve between during charge and discharge, has a judging unit that judges, on the basis of a charge-discharge state of the secondary battery, whether or not calculation of a current SOC of the secondary battery is possible; and a charge controlling unit that, when judged that the calculation
(Continued)

of the current SOC of the secondary battery is not possible by the judging unit, charges the secondary battery up to a predetermined fully charged state.

17 Claims, 10 Drawing Sheets

(51) Int. Cl.
 *G01R 31/36* (2006.01)
 *H01M 10/44* (2006.01)
 *H01M 10/48* (2006.01)

(52) U.S. Cl.
 CPC .......... *G01R 31/3624* (2013.01); *H02J 7/0047* (2013.01); *H02J 2007/005* (2013.01); *Y02E 60/122* (2013.01)

(58) Field of Classification Search
 USPC .............................. 320/134; 702/63; 324/427
 See application file for complete search history.

(56) References Cited

U.S. PATENT DOCUMENTS

| | | | | |
|---|---|---|---|---|
| 5,703,486 A * | 12/1997 | Arai | .................... | G01R 31/3651 320/DIG. 21 |
| 5,872,453 A * | 2/1999 | Shimoyama | .......... | G01R 19/32 320/153 |
| 6,621,250 B1 * | 9/2003 | Ohkubo | ............. | G01R 31/3613 320/136 |
| 7,071,654 B2 * | 7/2006 | Suzuki | ................. | H02J 7/0047 320/133 |
| 7,362,076 B2 * | 4/2008 | Namba | .............. | G01R 31/3651 320/149 |
| 7,459,884 B2 * | 12/2008 | Sasaki | ................ | G01R 31/3606 320/132 |
| 7,471,067 B2 * | 12/2008 | Tamezane | .......... | G01R 31/3651 320/129 |
| 7,974,795 B2 * | 7/2011 | Tohyama | ............. | G01R 31/361 320/127 |
| 8,193,777 B2 * | 6/2012 | Nakashima | ............. | H01M 2/16 320/141 |
| 8,487,630 B2 * | 7/2013 | Mori | ................... | H01M 10/482 320/116 |
| 8,541,986 B2 * | 9/2013 | Hiraoka | ............ | H01M 10/0525 320/162 |
| 8,896,271 B2 * | 11/2014 | Kim | .................... | H01M 10/443 320/136 |
| 2002/0113595 A1 | 8/2002 | Sakai et al. | | |
| 2006/0091862 A1 * | 5/2006 | Melichar | ............ | G01R 31/3648 320/132 |
| 2008/0180064 A1 * | 7/2008 | Miki | .................... | H02J 7/1461 320/136 |
| 2011/0181249 A1 * | 7/2011 | Deguchi | ........... | H01M 10/0525 320/149 |
| 2011/0279088 A1 * | 11/2011 | Yamamoto | ............ | H01M 10/44 320/134 |
| 2013/0013238 A1 * | 1/2013 | Kawakita | ................ | H02J 7/044 702/63 |
| 2013/0138370 A1 * | 5/2013 | Oh | ...................... | G01R 31/3624 702/63 |
| 2014/0320141 A1 * | 10/2014 | Kaburagi | .............. | H01M 10/48 324/426 |
| 2015/0022158 A1 * | 1/2015 | Osawa | .................. | H01M 4/505 320/134 |

FOREIGN PATENT DOCUMENTS

| | | |
|---|---|---|
| JP | 2000-261905 A | 9/2000 |
| JP | 2001-147260 A | 5/2001 |
| JP | 2004-031012 A | 1/2004 |
| JP | 2007-327971 A | 12/2007 |
| JP | 2008-270201 A | 11/2008 |
| JP | 2011-095209 A | 5/2011 |
| JP | 2011-204563 A | 10/2011 |
| WO | WO-2010/056226 A1 | 5/2010 |

OTHER PUBLICATIONS

USPTO Notice of Allowance, U.S. Appl. No 14/383,249, Sep. 30, 2016, 16 pages.

\* cited by examiner

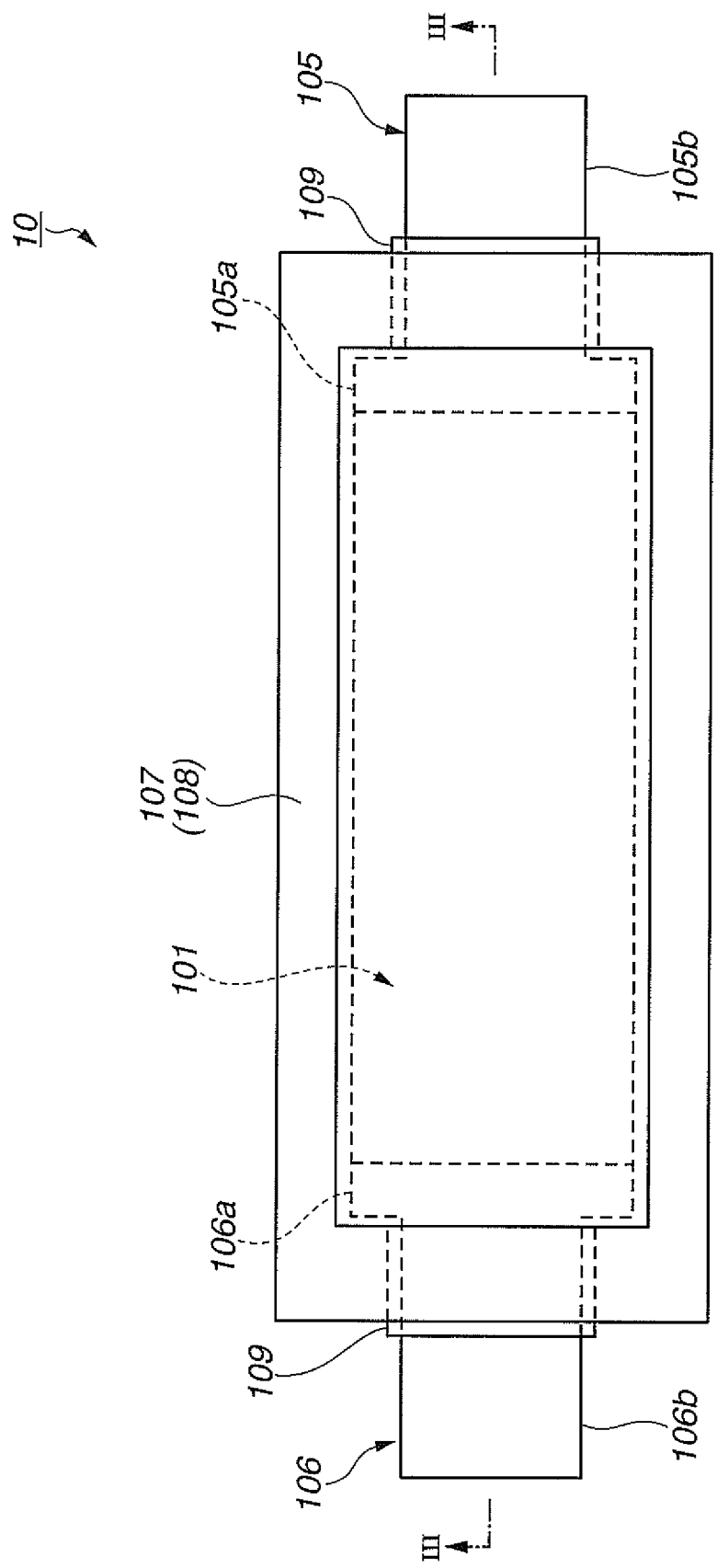

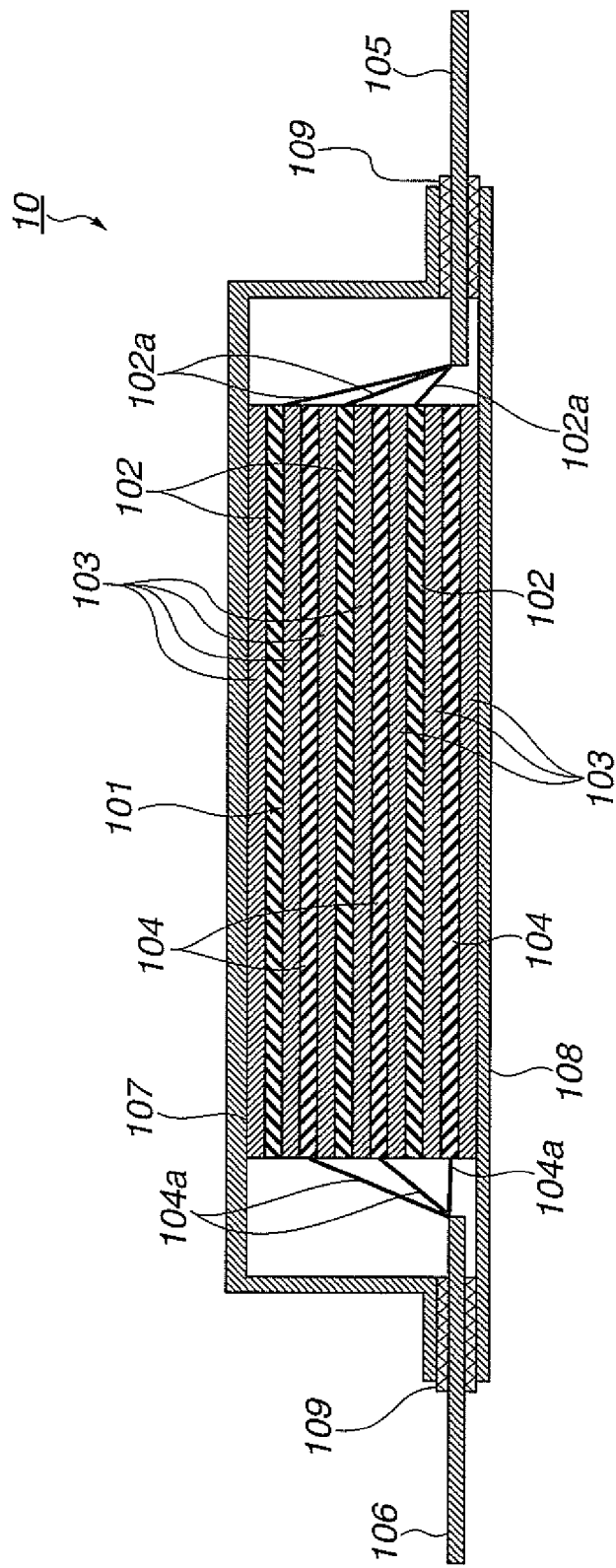

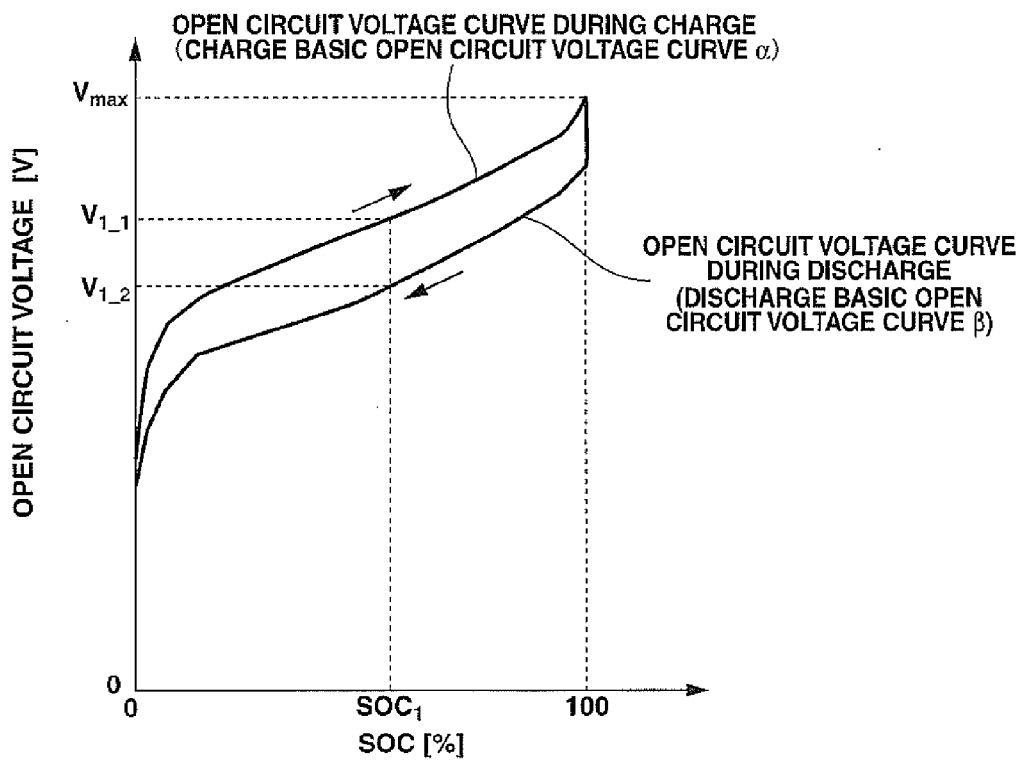
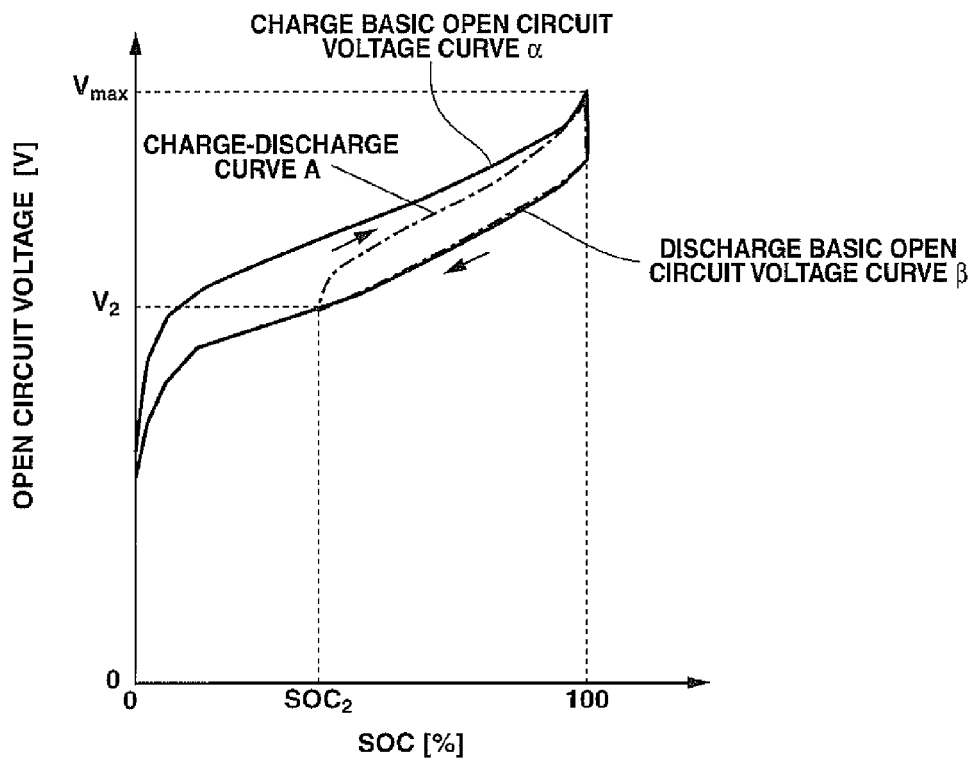

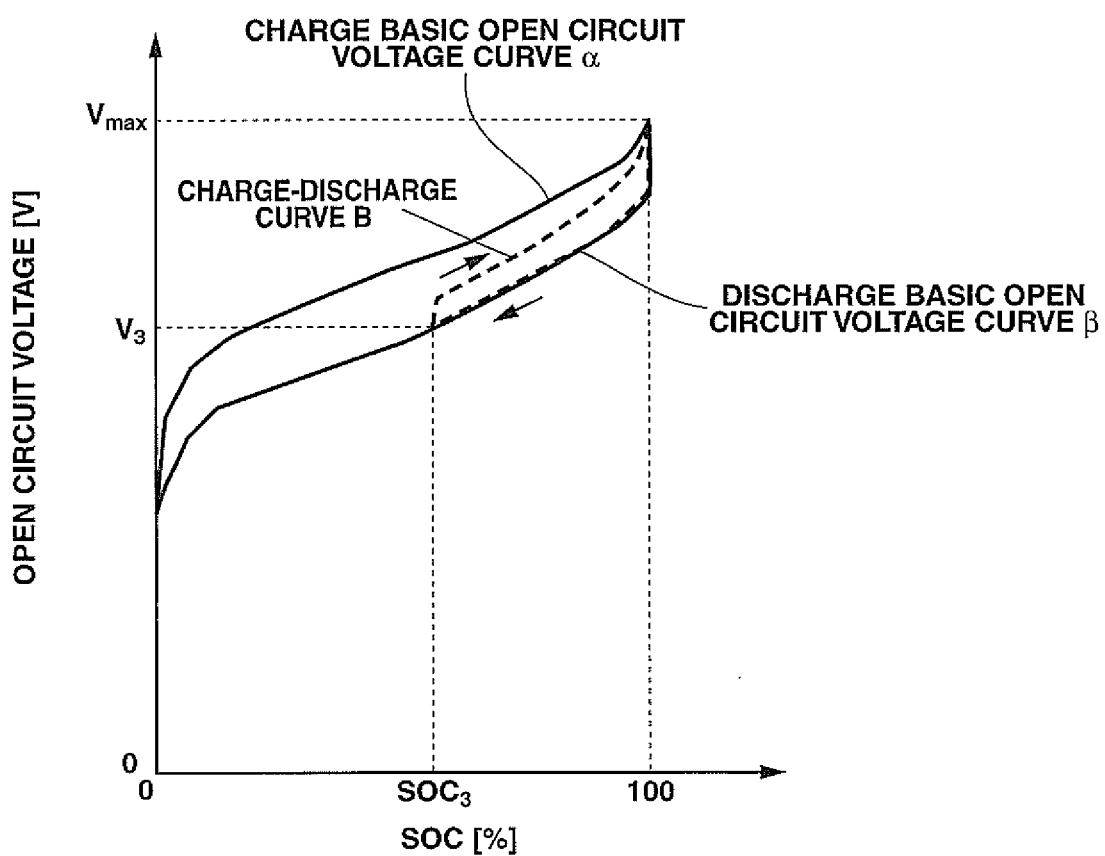

CONTROL DEVICE FOR SECONDARY BATTERY, CHARGING CONTROL METHOD, AND SOC DETECTION METHOD

TECHNICAL FIELD

The present invention relates to a control device of a secondary battery, a charging control method and an SOC detection method of the secondary battery.

BACKGROUND ART

In recent years, for a secondary battery such as a lithium secondary battery, various kinds of materials for positive electrode active material have been studied with the aim of achieving high voltage and high capacity. As such positive electrode active material, for instance, Patent Document 1 discloses solid solution material such as $Li_2MnO_3$—$LiMO_2$ (M is transition metal whose average oxidation state is 3+).

Regarding the solid solution material disclosed in Patent Document 1, depending on its composition etc., there is a case where a hysteresis phenomenon in which an open circuit voltage curve during charge and an open circuit voltage curve during discharge are quite different occurs. Then, when the positive electrode active material showing the occurrence of the hysteresis phenomenon is applied to the secondary battery, due to an influence of the hysteresis phenomenon, even if the open circuit voltage is the same, an SOC of the secondary battery is different between during charge and discharge. Thus, there is a problem that the SOC can not properly detected.

CITATION LIST

Patent Document

Patent Document 1: Japanese Patent Provisional Publication Tokkai No. 2008-270201

SUMMARY OF THE INVENTION

An object of the present invention, which solves the problem, is to properly detect, from the open circuit voltage, a current SOC of the secondary battery using, as the material of the positive electrode, the positive electrode active material that shows the difference of the open circuit voltage curve between during the charge and the discharge.

In the control device of the secondary battery using, as the positive electrode material, the positive electrode active material that shows the difference of the open circuit voltage curve between during charge and discharge, by judging, on the basis of a charge-discharge state of the secondary battery, whether or not calculation of the current SOC of the secondary battery is possible; and when judged that the calculation of the current SOC of the secondary battery is not possible, by charging the secondary battery up to a predetermined fully charged state, the present invention solves the problem.

According to the present invention, in the case where it is judged that the calculation of the current SOC of the secondary battery is not possible, by charging the secondary battery once up to the predetermined fully charged state, it is possible to properly detect the SOC during the discharge of the secondary battery using, as the positive electrode material, the positive electrode active material that shows the difference of the open circuit voltage curve between during the charge and the discharge.

BRIEF DESCRIPTION OF DRAWINGS

FIG. 2 is a plan view of the secondary battery of the present embodiment.

FIG. 3 is a sectional view of the secondary battery, taken along a line III-III of FIG. 2.

FIG. 4 is a graph showing a charge-discharge characteristic of the secondary battery of the present embodiment when performing a charge and a discharge from SOC=0% to SOC=100%.

FIG. 5 is a graph showing a charge-discharge characteristic of the secondary battery of the present embodiment when changing a charge-discharge state of the secondary battery from a discharge to a charge at an arbitrary SOC ($SOC_2$).

FIG. 6 is a graph showing a charge-discharge characteristic of the secondary battery of the present embodiment when changing the charge-discharge state of the secondary battery from the discharge to the charge at an arbitrary SOC ($SOC_3$).

DESCRIPTION OF EMBODIMENTS

In the following description, embodiments of the present invention will be explained with reference to the drawings.

First Embodiment

Figure 1:
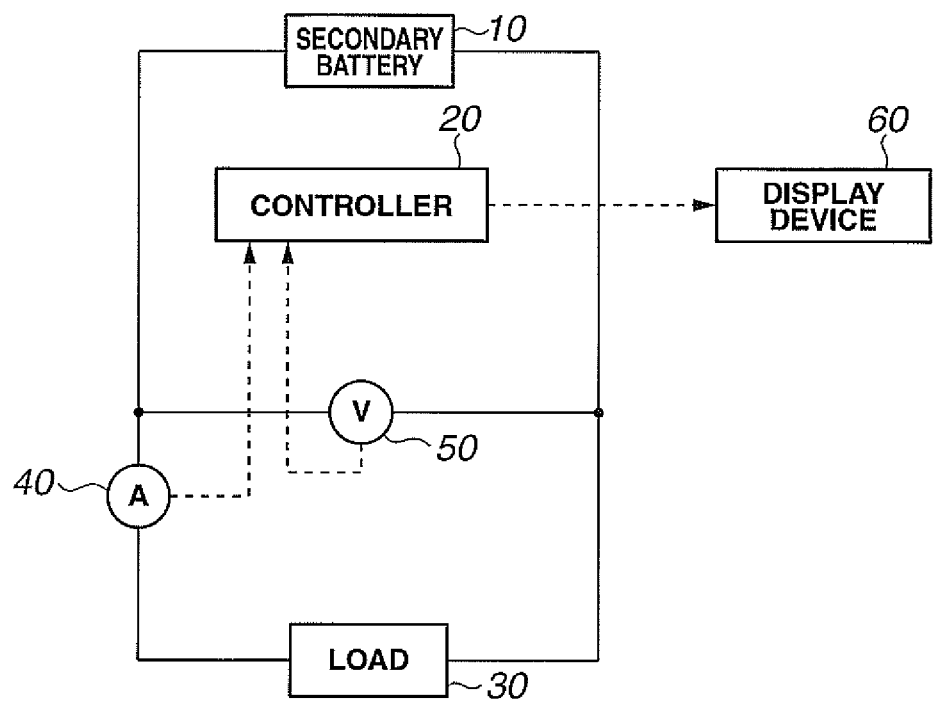
FIG. 1 is a block diagram showing a control system of a secondary battery according to a present embodiment.

FIG. 1 is a block diagram showing a control system of a secondary battery according to a present embodiment. As shown in FIG. 1, the control system of the secondary battery according to the present embodiment has a secondary battery 10, a controller (a control device) 20, a load 30, an ammeter 40, a voltmeter 50 and a display device 60.

The controller 20 is a device to control the secondary battery 10. The controller 20 controls charge and discharge of the secondary battery 10 and also calculates an SOC (State of Charge) of the secondary battery 10 and a remaining amount of power of the secondary battery 10 on the basis of a charge-discharge current flowing in the secondary battery 10 which is detected by the ammeter 40 and a terminal voltage of the secondary battery 10 which is detected by the voltmeter 50.

The load 30 is various devices that receive power supply from the secondary battery 10. For instance, in a case where the control system of the secondary battery of the present embodiment is applied to an electric vehicle, the load 30 is a load configured by an inverter and a motor. That is, in the case where the load 30 is configured by the inverter and the motor, a DC power supplied from the secondary battery 10 is converted to an AC power by the inverter, and is supplied to the motor. Further, in the case where the load 30 is configured by the inverter and the motor, a regenerative power generated by rotation of the motor is converted to the DC power through the inverter, and is used to charge the secondary battery 10.

The display device 60 is a device to display information of the remaining power amount calculated by the controller 20. For instance, in the case where the control system of the secondary battery of the present embodiment is applied to the electric vehicle, the display device 60 is used to inform an occupant of the electric vehicle of the remaining power amount of the secondary battery 10.

As the secondary battery 10, it is, for instance, a lithium-based secondary battery such as a lithium-ion secondary battery. FIG. 2 shows a plan view of the secondary battery 10 of the present embodiment. FIG. 3 shows a sectional view of the secondary battery 10, taken along a line III-III of FIG. 2.

As shown in FIGS. 2 and 3, the secondary battery 10 is formed from an electrode layered unit (an electrode stack) 101 having three positive electrode plates 102, seven separators 103 and three negative electrode plates 104, a positive electrode tab 105 and a negative electrode tab 106 which are each connected to the electrode stack 101, an upper jacket member 107 and a lower jacket member 108 which accommodate therebetween these electrode stack 101, positive electrode tab 105 and negative electrode tab 106 and seals them, and electrolyte (not shown).

Here, the number of each of the positive electrode plate 102, the separator 103 and the negative electrode plate 104 is not especially limited. The electrode stack 101 could be formed by one positive electrode plate 102, three separators 103 and one negative electrode plate 104. Further, the number of each of the positive electrode plate 102, the separator 103 and the negative electrode plate 104 could be selected as necessary.

The positive electrode plate 102 forming the electrode stack 101 has a positive electrode side current collector 102a that extends up to the positive electrode tab 105 and positive electrode active material layers that are formed on both main surfaces of a part of the positive electrode side current collector 102a. As the positive electrode side current collector 102a forming the positive electrode plate 102, it is, for instance, electrochemically stable metal leaf (or electrochemically stable metal foil) such as aluminium leaf (or foil), aluminium alloy leaf (or foil), copper titanium leaf (or foil) and stainless leaf (or foil), each of which has about 20 µm thickness.

The positive electrode active material layer forming the positive electrode plate 102 is formed by applying a mixture of positive electrode active material, a conductive agent such as carbon black and a binding agent such as aqueous dispersion of polyvinylidene fluoride or polytetrafluoroethylene to the main surfaces of a part of the positive electrode side current collector 102a and by drying and pressing them.

The secondary battery 10 of the present embodiment contains, as the positive electrode active material in the positive electrode active material layer forming the positive electrode plate 102, at least positive electrode active material that shows a difference of an open circuit voltage curve between during the charge and the discharge, i.e. positive electrode active material having hysteresis in a charge-discharge curve. As such the positive electrode active material showing the difference of the open circuit voltage curve between during the charge and the discharge, it is not especially limited. It is, for instance, a compound expressed by the following general expression (1). In particular, since the compound expressed by the following general expression (1) has high potential (high voltage) and high capacity, using this compound as the positive electrode active material enables the secondary battery 10 to have high energy density. Here, the compound expressed by the following general expression (1) normally forms solid solution.

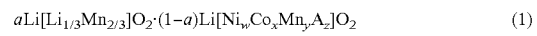
$$aLi[Li_{1/3}Mn_{2/3}]O_2 \cdot (1-a)Li[Ni_wCo_xMn_yA_z]O_2 \qquad (1)$$

(0<a<1, w+x+y+z=1, 0≤w, x, y, z≤1, A is metallic element)

In the compound expressed by the above general expression (1), as the "A", it is not especially limited as long as the "A" is the metallic element (metallic element except Li, Ni, Co and Mn). However, at least one element selected from Fe, V, Ti, Al and Mg is preferable, and Ti is far preferable.

Further, in the compound expressed by the above general expression (1), although the "w", "x", "y", "z" are not especially limited as long as the "w", "x", "y", "z" meet w+x+y+z=1 and 0≤w, x, y, z≤1, it is preferable that z be 0 (z=0). That is, it is preferable that the compound be a compound expressed by the following general expression (2)

$$aLi[Li_{1/3}Mn_{2/3}]O_2 \cdot (1-a)Li[Ni_wCo_xMn_y]O_2 \qquad (2)$$

(0<a<1, w+x+y=1, 0≤w, x, y≤1)

Here, the positive electrode active material layer could contain positive electrode active material except the positive electrode active material showing the difference of the open circuit voltage curve between during the charge and the discharge, for instance, lithium compound oxide such as lithium nickelate ($LiNiO_2$), lithium manganate ($LiMn_2O_4$) and lithium cobalt oxide (lithium cobaltate) ($LiCoO_2$), $LiFePO_4$ and $LiMnPO_4$.

Each of the positive electrode side current collectors 102a forming the three positive electrode plates 102 is connected to the positive electrode tab 105. As the positive electrode tab 105, for instance, aluminium leaf (or foil), aluminium alloy leaf (or foil), copper leaf (or foil) and nickel leaf (or foil), each of which has about 0.2 mm thickness, could be used.

The negative electrode plate 104 forming the electrode stack 101 has a negative electrode side current collector 104a that extends up to the negative electrode tab 106 and negative electrode active material layers that are formed on both main surfaces of a part of the negative electrode side current collector 104a.

The negative electrode side current collector 104a of the negative electrode plate 104 is, for instance, electrochemically stable metal leaf (or electrochemically stable metal foil) such as nickel leaf (or foil), copper leaf (or foil), stainless leaf (or foil) and iron leaf (or foil), each of which has about 10 µm thickness.

The negative electrode active material layer forming the negative electrode plate 104 is formed, for example, as follows. By preparing a slurry by adding a binding agent such as polyvinylidene and a solvent such as N-2-methylpyrrolidone to negative electrode active material such as non-graphitizable carbon, graphitizable carbon and graphite, and by applying the slurry to the both main surfaces of a part of the negative electrode side current collector 104a, then by drying and pressing them, the negative electrode active material layer is formed.

In the secondary battery 10 of the present embodiment, the three negative electrode plates 104 are formed so that each of the negative electrode side current collectors 104a forming the negative electrode plates 104 is connected to the single negative electrode tab 106. That is, in the secondary battery 10 of the present embodiment, each negative electrode plate 104 is formed so as to connect to the single common negative electrode tab 106.

The separator 103 of the electrode stack 101 is an element that prevents a short circuit between the positive electrode plate 102 and the negative electrode plate 104. The separator 103 might have a function of holding the electrolyte. This separator 103 is a microporous film formed from, for instance, polyolefine such as polyethylene (PE) and polypropylene (PP) each having about 25 μm thickness, which also has a function of interrupting current by the fact that when overcurrent (excess current) flows, pores on the layer are closed by heat of the overcurrent.

As shown in FIG. 3, by alternately arranging the positive electrode plate 102 and the negative electrode plate 104 in layers through the separator 103 and also by arranging the separator 103 on an uppermost layer and a lowermost layer of this layered arrangement, the electrode stack 101 is formed.

The electrolyte which the secondary battery 10 contains is liquid obtained by dissolving, as a solute, lithium salt such as lithium tetrafluoroborate ($LiBF_4$) and lithium hexafluorophosphate ($LiPF_6$) in organic liquid solvent. As the organic liquid solvent forming the electrolyte, it is, for instance, ester-based solvent such as propylene carbonate (PC), ethylene carbonate (EC), buthylene carbonate (BC), dimethyl carbonate (DMC), ethyl methyl carbonate (EMC), diethyl carbonate (DEC), methyl formate (MF), methyl acetate (MA) and methyl propionate (MP). These could be used as a mixture.

The electrode stack 101 formed in this manner is accommodated between and sealed with the upper jacket member 107 (sealing means or element) and the lower jacket member 108 (sealing means or element). The upper jacket member 107 and the lower jacket member 108 to seal the electrode stack 101 are formed by material having flexibility, e.g. a resin film such as polyethylene and polypropylene or a resin-metal thin film laminate material obtained by bonding (or laminating) resin such as the polyethylene and the polypropylene onto both surfaces of metal foil such as aluminum. By thermal-bonding (heat-bonding) these upper jacket member 107 and lower jacket member 108, the electrode stack 101 is sealed with the positive electrode tab 105 and the negative electrode tab 106 coming out to the outside.

The positive electrode tab 105 and the negative electrode tab 106 are each provided with a seal film 109 to secure absolute contact with the upper jacket member 107 and the lower jacket member 108 at portions where each of the positive electrode tab 105 and the negative electrode tab 106 contacts the upper jacket member 107 and the lower jacket member 108. As the seal film 109, it is not especially limited. It can be formed from, for instance, synthetic resin material having excellent resistance of electrolyte and good thermal adhesion performance such as polyethylene, modified polyethylene, polypropylene, modified polypropylene and ionomer.

The secondary battery 10 of the present embodiment is formed in the manner described above.

Next, a charge-discharge characteristic of the secondary battery 10 of the present embodiment will be explained.

As described above, the secondary battery 10 uses, as the positive electrode active material, the positive electrode active material showing the difference of the open circuit voltage curve between during the charge and the discharge, i.e. the positive electrode active material having the hysteresis in the charge-discharge curve. Because of this, as shown in FIG. 4, in a case where the charge is performed from SOC=0% to SOC=100% and afterwards the discharge is performed from SOC=100% to SOC=0%, the open circuit voltage curve during the charge and the open circuit voltage curve during the discharge are different, and the secondary battery 10 has the hysteresis. Here, in the present embodiment, as shown in FIG. 4, a charge open circuit voltage curve when performing the charge from SOC=0% to SOC=100% is called a charge basic open circuit voltage curve α, and a discharge open circuit voltage curve when performing the discharge from SOC=100% to SOC=0% is called a discharge basic open circuit voltage curve β. That is, as shown in FIG. 4, when charging the secondary battery 10 from SOC=0%, an open circuit voltage of the secondary battery 10 is increased with rise of the SOC according to or along the charge basic open circuit voltage curve α shown in FIG. 4. Then, when discharging the secondary battery 10 by changing (switching) the state of the secondary battery 10 from the charge to the discharge after the secondary battery 10 is fully charged up to a predetermined fully charged state, i.e. a fully charged voltage Vmax (SOC=100%), the secondary battery 10 is discharged according to or along the discharge basic open circuit voltage curve β shown in FIG. 4.

That is, as shown in FIG. 4, the secondary battery 10 has properties that, even same SOC, a value of the open circuit voltage is quite different between during the charge and the discharge. For this reason, even though the SOC is a same $SOC_1$ as shown in FIG. 4, the open circuit voltage during the charge is $V_{1\_1}$, whereas the open circuit voltage during the discharge is $V_{1\_2}$, then a voltage difference $\Delta V = V_{1\_1} - V_{1\_2}$ arises at the charge and the discharge.

Here, in FIG. 4, the case where the charge is performed from SOC=0% to SOC=100% and afterwards the discharge is performed from SOC=100% to SOC=0% is explained as an example. However, even in a case where such a charge-discharge operation is performed at an arbitrary SOC (for instance, the charge is performed from SOC=30% to SOC=70% and the discharge is performed from SOC=70% to SOC=30%), in the same manner as the above case, the secondary battery 10 has the hysteresis in the charge-discharge curve.

On the other hand, as shown in FIG. 5 as a charge-discharge curve A (indicated by a dashed line in FIG. 5), in a case where, after the discharge is performed from a predetermined fully charged voltage Vmax up to $SOC_2$, the state is changed (switched) from the discharge to the charge then the charge is performed up to the fully charged voltage Vmax, the charge-discharge curve becomes the following curve. That is, in a case where the discharge is performed according to or along the discharge basic open circuit voltage curve β during the discharge and afterwards the charge is performed by changing (switching) the state from the discharge to the charge at $SOC_2$, a charge curve is different from the charge basic open circuit voltage curve α. However, when the discharge is performed again after the charge is performed up to the predetermined fully charged voltage Vmax, the discharge is performed according to or along the discharge basic open circuit voltage curve β.

Likewise, as shown in FIG. 6 as a charge-discharge curve B (indicated by a broken line in FIG. 6), also in a case where, after the discharge is performed up to $SOC_3$ that is different from the above SOC, the state is changed (switched) from the discharge to the charge then the charge is performed up to the fully charged voltage Vmax, the same tendency (or the same characteristic) appears. That is, in either case of FIG. 5 and FIG. 6, when discharging the secondary battery 10 from the predetermined fully charged voltage Vmax, the discharge is performed according to or along the discharge basic open circuit voltage curve β. This tendency (this characteristic) is not dependent on an SOC (e.g. $SOC_2$ and $SOC_3$ in FIG. 5 and FIG. 6) at a time of charging start when charging the secondary battery 10 up to the predetermined fully charged voltage Vmax. That is, in the case where the discharge is performed from the predetermined fully charged voltage Vmax, regardless of a charge-discharge history before the discharge, the discharge is performed uniformly according to or along the discharge basic open circuit voltage curve β.

Consequently, in the present embodiment, on the basis of such a charge-discharge characteristic of the secondary battery 10, by previously storing the discharge basic open circuit voltage curve β that is a discharge curve when performing the discharge from the predetermined fully charged voltage Vmax in the controller 20 and by using this discharge basic open circuit voltage curve β, the SOC of the secondary battery 10 is calculated by the controller 20, and the remaining power amount is calculated on the basis of the calculated SOC. Especially when the control system of the secondary battery of the present embodiment is applied to the electric vehicle, since normally the secondary battery 10 is used after being charged up to the predetermined fully charged state, in this case, the discharge is performed according to or along the discharge basic open circuit voltage curve β. Thus, by previously storing the discharge basic open circuit voltage curve β and by calculating the SOC and the remaining power amount of the secondary battery 10 on the basis of this stored discharge basic open circuit voltage curve β, it is possible to properly or rightly calculate these SOC and remaining power amount.

Regarding the discharge basic open circuit voltage curve β, in the present embodiment, for instance, the discharge basic open circuit voltage curve β can be obtained by an actual measurement of data collected when actually charging the secondary battery 10 up to the predetermined fully charged voltage Vmax and afterwards actually discharging the secondary battery 10.

In FIGS. 4 to 6, as an example, the charge-discharge characteristic in the case of configuration where the compound expressed by the general expression (2) is used as the positive electrode active material and this positive electrode active material and the graphite negative electrode are combined is shown. However, the present invention is not limited to this combination or configuration.

Figure 7:
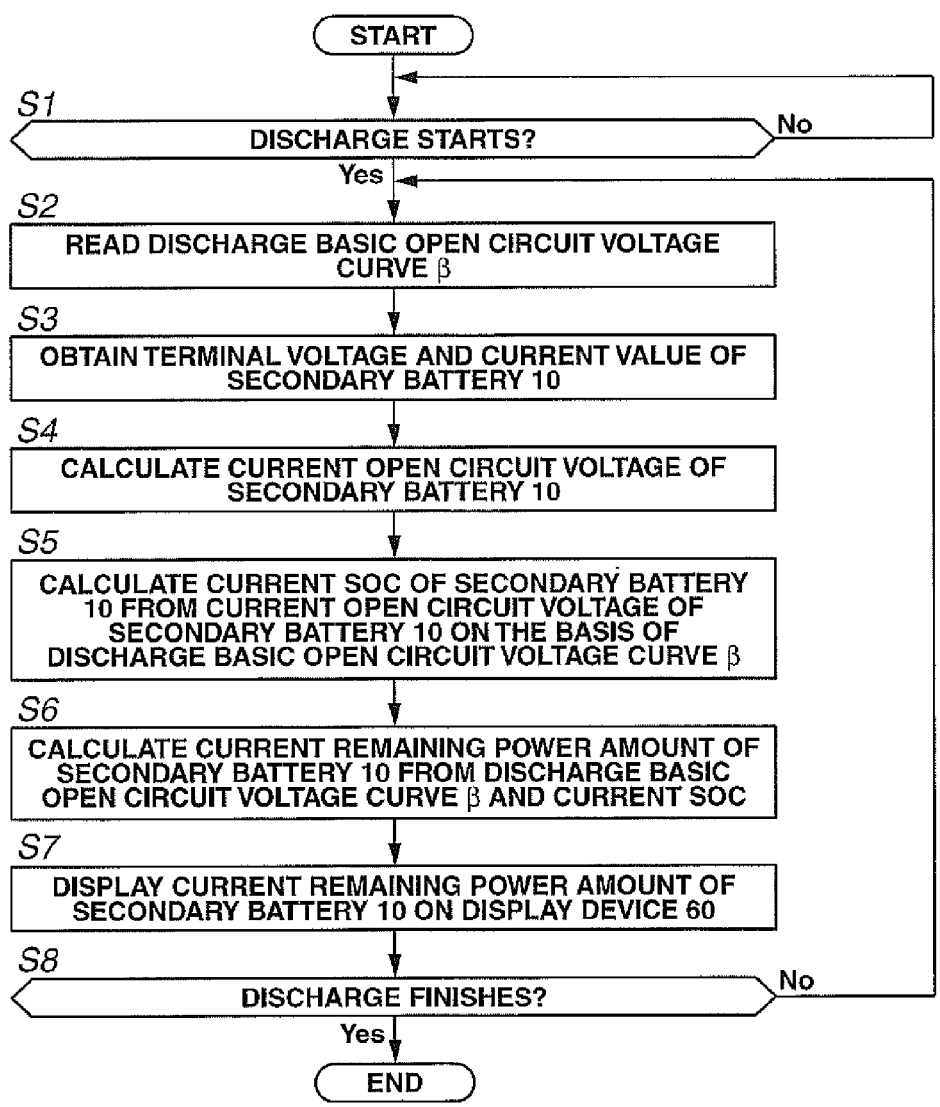
FIG. 7 is a flow chart showing a process executed in the control system of the secondary battery according to a first embodiment.

Next, an example of operation of the present embodiment will be explained. FIG. 7 is a flow chart showing an SOC calculation process in the present embodiment. In the following description, an example of operation in a case where the secondary battery 10 is charged up to the predetermined fully charged voltage Vmax and afterwards the discharge of the secondary battery 10 is performed will be explained.

First, at step S1, a judgment is made as to whether or not the discharge of the secondary battery 10 from the fully charged state is started by the controller 20. If the discharge is started, the routine proceeds to step S2. On the other hand, if the discharge is not started, the routine waits at step S1.

At step S2, an operation of reading the discharge basic open circuit voltage curve β previously stored in the controller 20 is performed by the controller 20.

Subsequently, at step S3, an operation of obtaining the terminal voltage of the secondary battery 10 measured by the voltmeter 50 and the current value of the secondary battery 10 measured by the ammeter 40 is performed by the controller 20.

At step S4, an operation of calculating a current open circuit voltage of the secondary battery 10 from the terminal voltage and the current value of the secondary battery 10 obtained at step S2 is performed by the controller 20. Here, as a calculating manner of the current open circuit voltage of the secondary battery 10, it is not especially limited. For instance, it could be a manner in which, using a plurality of data of the terminal voltage and the current value of the secondary battery 10, a value of the terminal voltage when the current value is zero is estimated from the plurality of data of the terminal voltage and the current value using a regression line, and this value is calculated as the open circuit voltage.

At step S5, an operation of calculating a current SOC of the secondary battery 10 from the current open circuit voltage of the secondary battery 10 calculated at step S4 on the basis of the discharge basic open circuit voltage curve β read at step S2 is performed by the controller 20. When explaining the case shown in FIG. 4 as an example, for instance, in a case where the current open circuit voltage of the secondary battery 10 calculated at step S4 is $V_{1\_2}$, an SOC corresponding to the open circuit voltage $V_{1\_2}$, i.e. $SOC_1$ is calculated from the discharge basic open circuit voltage curve β as the current SOC of the secondary battery 10.

Figure 8:
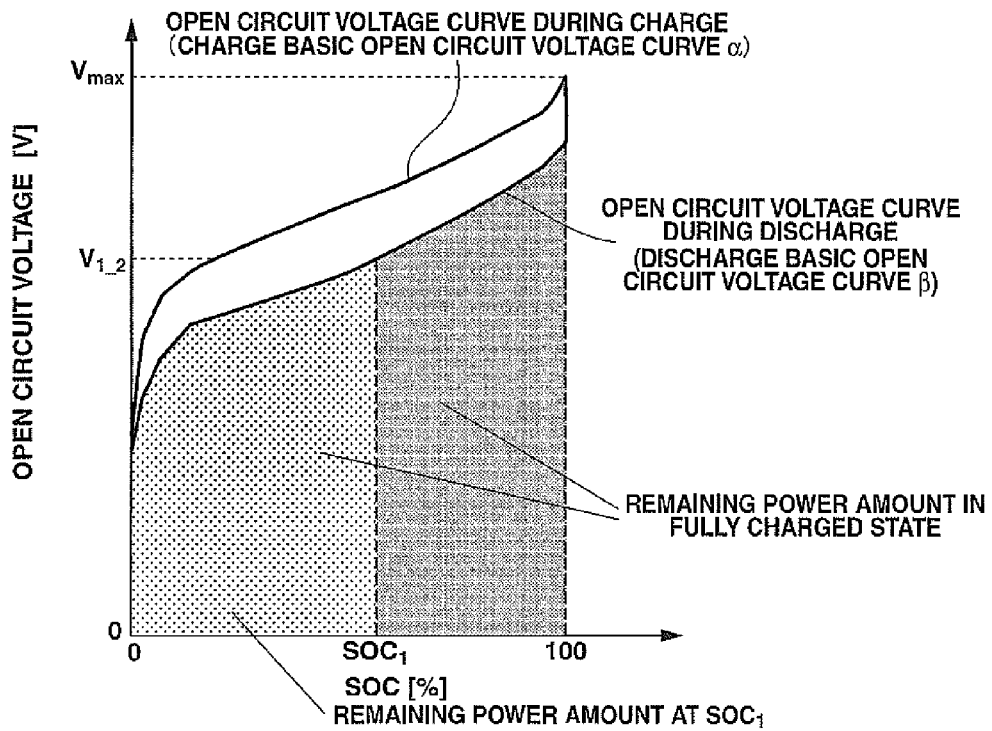
FIG. 8 is a drawing for explaining a method of calculating a current remaining amount of power of a secondary battery 10 according to the present embodiment.

Next, at step S6, an operation of calculating a current remaining power amount of the secondary battery 10 on the basis of the current SOC of the secondary battery 10 calculated at step S5 is performed by the controller 20. Here, FIG. 8 is a drawing for explaining a method of calculating the current remaining power amount of the secondary battery 10. As shown in FIG. 8, for instance, in a case where the current SOC of the secondary battery 10 is $SOC_1$, an area (an integral value from SOC=0% to SOC=$SOC_1$) enclosed by the discharge basic open circuit voltage curve β, a line of SOC=$SOC_1$, an X-axis (that gives SOC and is a line of the open circuit voltage=0V) and a Y-axis (that gives the open circuit voltage and is a line of SOC=0%) in FIG. 8 indicates the remaining power amount (unit:Wh). Thus, in the present embodiment, by this manner, the calculation of the remaining power amount of the secondary battery 10 is made on the basis of the current SOC of the secondary battery 10 calculated at step S5 and the discharge basic open circuit voltage curve β.

Here, in the present embodiment, instead of the calculation of the remaining power amount of the secondary battery 10 or in addition to the calculation of the remaining power amount of the secondary battery 10, a ratio of remaining power could be calculated according to the following expression (3).

$$\text{remaining power ratio (\%)} = \text{remaining power amount of the secondary battery 10/remaining power amount in the fully charged state} \times 100 \quad (3)$$

Here, the remaining power amount in the fully charged state can be calculated by determining an area (an integral value from SOC=0% to SOC=100%) enclosed by the discharge basic open circuit voltage curve β, a line of SOC=100%, the X-axis (that gives SOC and is the line of the open circuit voltage=0V) and the Y-axis (that gives the open circuit voltage and is the line of SOC=0%) in FIG. 8.

Subsequently, at step S7, information of the remaining power amount of the secondary battery 10 calculated at step S6 is sent from the controller 20 to the display device 60, and an operation of displaying the information of the remaining power amount of the secondary battery 10 on the display device 60 is performed. In the case where, instead of the calculation of the remaining power amount of the secondary battery 10 or in addition to the calculation of the remaining power amount of the secondary battery 10, the remaining power ratio of the secondary battery 10 is calculated, instead of the remaining power amount of the secondary battery 10 or in addition to the remaining power amount of the secondary battery 10, the remaining power ratio of the secondary battery 10 could be displayed as the information displayed on the display device 60.

At step S8, a judgment is made as to whether or not the discharge of the secondary battery 10 is finished by the controller 20. If the discharge of the secondary battery 10 is not finished, the routine returns to step S2, then the operation of the steps S2 to S7 described above is repeated until the discharge of the secondary battery 10 is finished. If the discharge of the secondary battery 10 is finished, the present operation is terminated.

According to the present embodiment, the discharge curve when performing the discharge from the predetermined fully charged state, i.e. the fully charged voltage Vmax (SOC=100%) is previously stored as the discharge basic open circuit voltage curve β, then when the discharge is performed from the predetermined fully charged voltage Vmax, the current SOC of the secondary battery 10 is calculated from the current open circuit voltage of the secondary battery 10 on the basis of the discharge basic open circuit voltage curve β. Therefore, the current SOC of the secondary battery 10 when performing the discharge from the predetermined fully charged voltage Vmax can be accurately calculated.

In addition, according to the present embodiment, as the charge-discharge curve used for the calculation of the current SOC of the secondary battery 10, at least only the discharge basic open circuit voltage curve β when performing the discharge from the predetermined fully charged voltage Vmax is stored. Thus, a data capacity in the controller 20 can be reduced. Further, also when making a correction according to a temperature change or degree of deterioration of the secondary battery 10, since it is required to at least correct only the discharge basic open circuit voltage curve β, not only the reduction of the data capacity, but an operation load can be lightened as well. Especially when the control system of the secondary battery of the present embodiment is applied to the electric vehicle, normally the secondary battery 10 is used after being charged up to the predetermined fully charged state. In this case, since the discharge is performed according to or along the discharge basic open circuit voltage curve β, at least by storing only the discharge basic open circuit voltage curve β, it is possible to properly or rightly calculate the current SOC of the secondary battery 10 on the basis of the discharge basic open circuit voltage curve β.

Moreover, according to the present embodiment, as shown in FIG. 8, by using the discharge basic open circuit voltage curve β when performing the discharge from the predetermined fully charged voltage Vmax (SOC=100%), it is also possible to accurately calculate the remaining power amount (a dischargeable power amount) form the current SOC of the secondary battery 10.

Second Embodiment

Next, a second embodiment will be explained.

In the second embodiment, a judgment is made as to whether or not the calculation of the current SOC of the secondary battery 10 is possible. When judged that the calculation of the current SOC of the secondary battery 10 is not possible, a control that charges the secondary battery 10 up to the predetermined fully charged voltage Vmax (SOC=100%) is carried out. Configuration and operation of the second embodiment except this control are the same as those of the first embodiment described above.

The charge-discharge characteristic of the secondary battery 10 of the present embodiment will be explained here. The secondary battery 10 of the present embodiment has the following characteristic, in addition to the characteristic explained above in the first embodiment.

Figure 9:
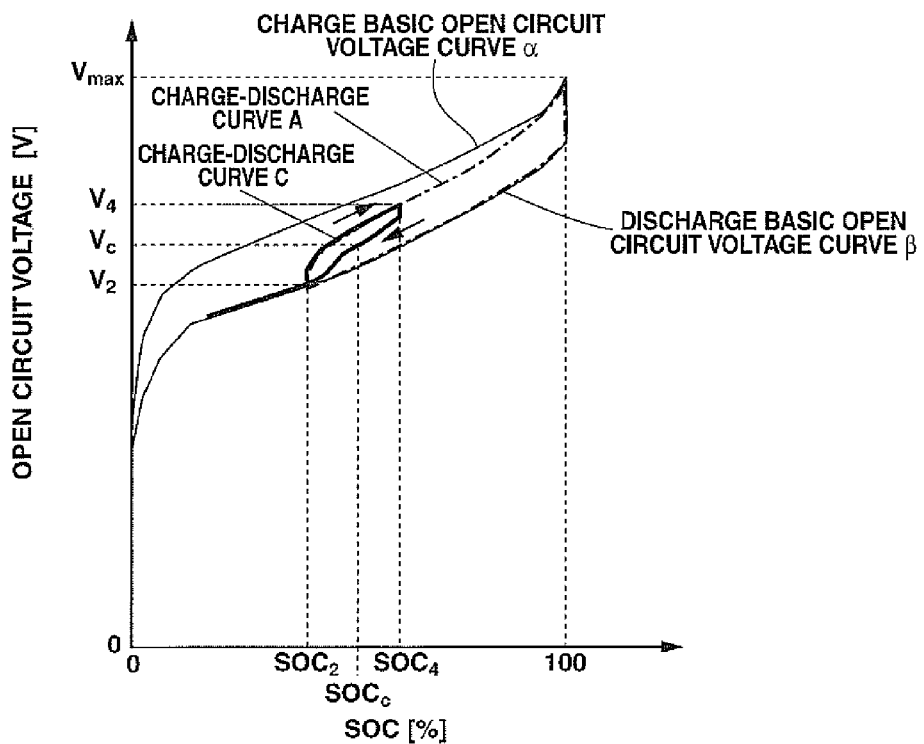
FIG. 9 is a graph showing a charge-discharge characteristic of the secondary battery of the present embodiment when changing the charge-discharge state of the secondary battery from the charge to the discharge at an arbitrary SOC ($SOC_4$) after performing the charge along a re-charge open circuit voltage curve $\gamma_{SOC}$.

As shown in FIG. 9, in a case where, after discharging the secondary battery 10 according to or along the discharge basic open circuit voltage curve 3, the charge is performed by changing (switching) the state from the discharge to the charge at $SOC_2$, as indicated by a charge-discharge curve C in FIG. 9, the charge is performed according to or along a re-charge open circuit voltage curve γ (i.e. an open circuit voltage curve corresponding to the charge-discharge curve A) that corresponds to $SOC_2$, which is described above. Then, when the charge is performed up to $SOC_4$ and the discharge is performed again by changing (switching) the state from the charge to the discharge, as indicated by the charge-discharge curve C in FIG. 9, the discharge is performed according to or along a discharge curve corresponding to $SOC_4$ that is an SOC at a time when changing the state from the charge to the discharge until $SOC_2$ that is a changeover $SOC_{charge}$. Further, when the SOC passes through $SOC_2$ of the changeover $SOC_{charge}$, the discharge is performed according to or along the discharge basic open circuit voltage curve β.

Here, the charge-discharge curve C shown in FIG. 9 is a curve that indicates an open circuit voltage curve during the charge and the discharge when the following charge-discharge operation is performed.

(1) after the discharge is performed according to or along the discharge basic open circuit voltage curve β, the charge is performed up to $SOC_4$ by changing (switching) the state from the discharge to the charge at $SOC_2$, and (2) the state is changed from the charge to the discharge at $SOC_4$, and the discharge is performed up to an arbitrary SOC beyond $SOC_2$ That is, in the case of the secondary battery 10 of the present embodiment, as shown in FIG. 9, when the discharge is performed according to or along the discharge basic open circuit voltage curve β and afterwards the charge is performed up to a predetermined SOC (SOC≠100%) by changing the state from the discharge to the charge then the discharge is performed again, the discharge does not proceed according to or along the discharge basic open circuit voltage curve β (namely that the charge-discharge curve is not fitted to the discharge basic open circuit voltage curve β) until an SOC ($SOC_2$ in the example shown FIG. 9) at a time when changing the state from the discharge to the charge. In this case, it is impossible to calculate the current SOC of the secondary battery 10 using the discharge basic open circuit voltage curve β like the manner of the first embodiment. Therefore, in the present embodiment, in the case where the calculation of the current SOC of the secondary battery 10 is impossible, by charging the secondary battery 10 once up to the predetermined fully charged voltage Vmax, a behavior of the open circuit voltage curve of the secondary battery 10 during the discharge (in the discharge process) is fitted to the discharge basic open circuit voltage curve β again. With this operation, the calculation of the current SOC of the secondary battery 10 based on the discharge basic open circuit voltage curve β, which is explained in the first embodiment above, becomes possible.

Next, an example of operation of the second embodiment will be explained with reference to a flow chart shown in FIG. 10. As compared with the operation (FIG. 7) of the first embodiment, steps S101 and S102 are added in the second embodiment. Except for these steps, the operation of the second embodiment is the same as the first embodiment.

Figure 10:
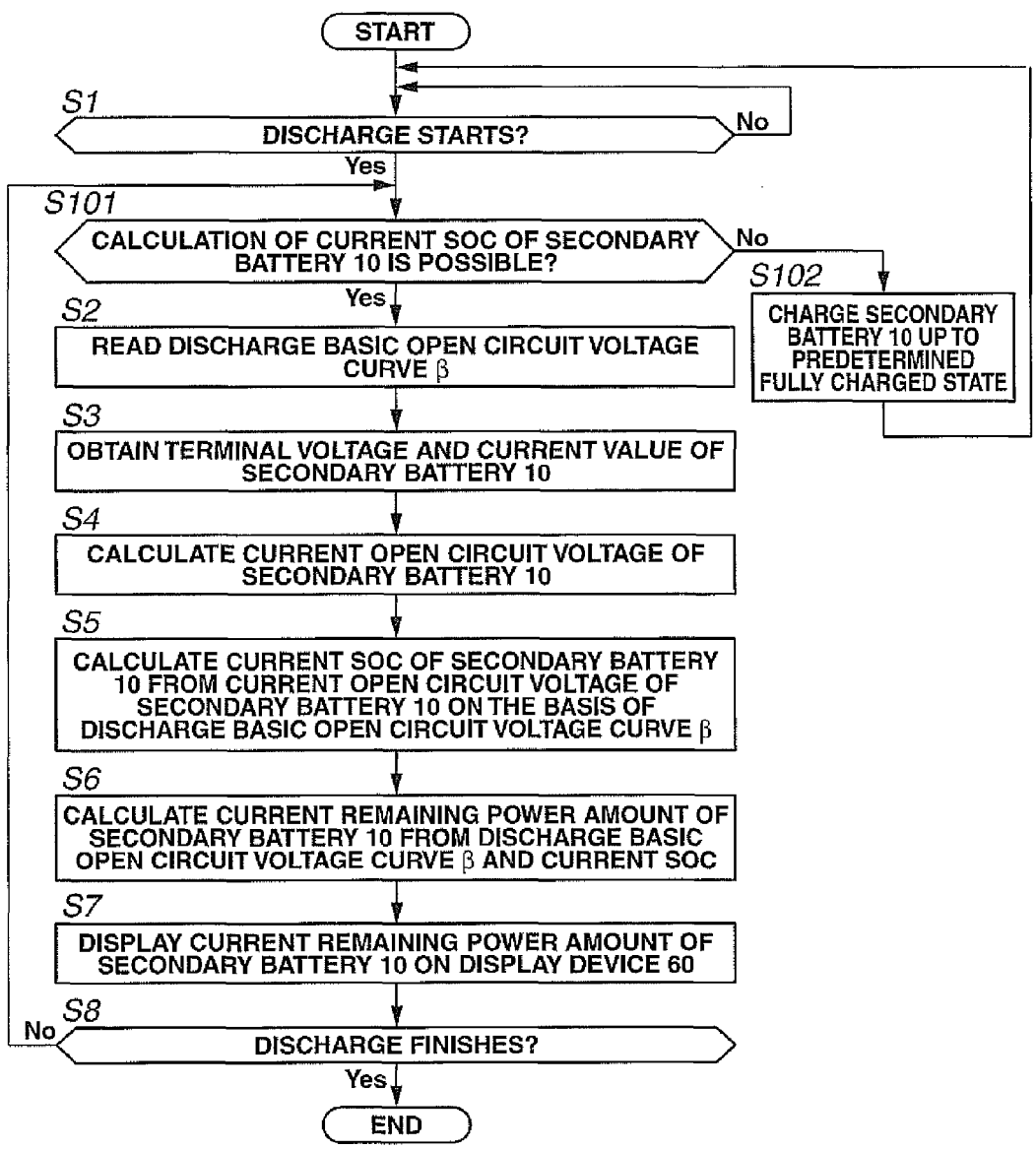
FIG. 10 is a flow chart showing a process executed in the control system of the secondary battery according to a second embodiment.

As shown in FIG. 10, when judged that the discharge of the secondary battery 10 from the fully charged state is started at step S1, the routine proceeds to step S101, then a judgment is made as to whether or not the calculation of the current SOC of the secondary battery 10 is possible. Here, as a manner of judging whether the calculation of the current SOC of the secondary battery 10 is possible, it is not especially limited. For instance, it could be a case in which, if it can be judged that the discharge of the secondary battery 10 does not correspond to the discharge basic open circuit voltage curve β, as shown in FIG. 9, the discharge is performed according to or along the discharge basic open circuit voltage curve β and afterwards the charge is performed up to a predetermined SOC (SOC≠100%) by changing the state from the discharge to the charge and further the discharge is performed again.

When judged that the calculation of the current SOC of the secondary battery 10 is not possible at step S101, the routine proceeds to step S102. At step S102, a control to charge the secondary battery 10 up to the predetermined fully charged state is carried out. When the secondary battery 10 is charged up to the predetermined fully charged state, the routine returns to step S1.

On the other hand, when judged that the calculation of the current SOC of the secondary battery 10 is possible at step S101, the routine proceeds to step S2, then in the same manner as the first embodiment, processes of steps S2 to S8 are executed.

According to the second embodiment, in addition to the effects of the first embodiment, the following effect is obtained.

That is, according to the second embodiment, in the case where the calculation of the current SOC of the secondary battery 10 is impossible, by charging the secondary battery 10 once up to the predetermined fully charged voltage Vmax, the behavior of the open circuit voltage curve of the secondary battery 10 during the discharge can be fitted to the discharge basic open circuit voltage curve β again. With this operation, the calculation of the current SOC of the secondary battery 10 based on the discharge basic open circuit voltage curve β, which is explained in the first embodiment above, becomes possible. Accordingly, the calculation of the current SOC of the secondary battery 10 can be properly made.

Third Embodiment

Next, a third embodiment will be explained.

In the third embodiment, a judgment is made as to whether or not the calculation of the current SOC of the secondary battery 10 is possible. When judged that the calculation of the current SOC of the secondary battery 10 is not possible, a control that discharges the secondary battery 10 up to a predetermined SOC is carried out. Configuration and operation of the third embodiment except this control are the same as those of the second embodiment described above.

That is, as explained in the second embodiment, in FIG. 9, in the case where the secondary battery 10 is charged by changing (switching) the state from the discharge to the charge at $SOC_2$ and this charge is performed up to $SOC_4$ then the discharge is performed again by changing (switching) the state from the charge to the discharge, as indicated by the charge-discharge curve C in FIG. 9, the discharge is performed according to or along the discharge curve that is different from the discharge basic open circuit voltage curve β until $SOC_2$ that is the changeover $SOC_{charge}$, whereas when the SOC passes through $SOC_2$ of the changeover $SOC_{charge}$, the discharge is performed according to or along the discharge basic open circuit voltage curve β.

Therefore, in the present embodiment, in the case where the discharge is performed and afterwards the charge is performed up to the predetermined SOC (SOC≠100%) by changing the state from the discharge to the charge then the discharge is performed again, by discharging the secondary battery 10 up to the changeover $SOC_{charge}$ that is the SOC at a time when changing the state from the discharge to the charge, a behavior of the open circuit voltage curve of the secondary battery 10 during the discharge (in the discharge process) is fitted to the discharge basic open circuit voltage curve β. With this operation, the calculation of the current SOC of the secondary battery 10 based on the discharge basic open circuit voltage curve β, which is explained in the first embodiment above, becomes possible.

Next, an example of operation of the third embodiment will be explained with reference to a flow chart shown in FIG. 11. As compared with the operation (FIG. 10) of the second embodiment, instead of step S102, step S201 is added in the third embodiment. Except for this step, the operation of the third embodiment is the same as the second embodiment.

Figure 11:
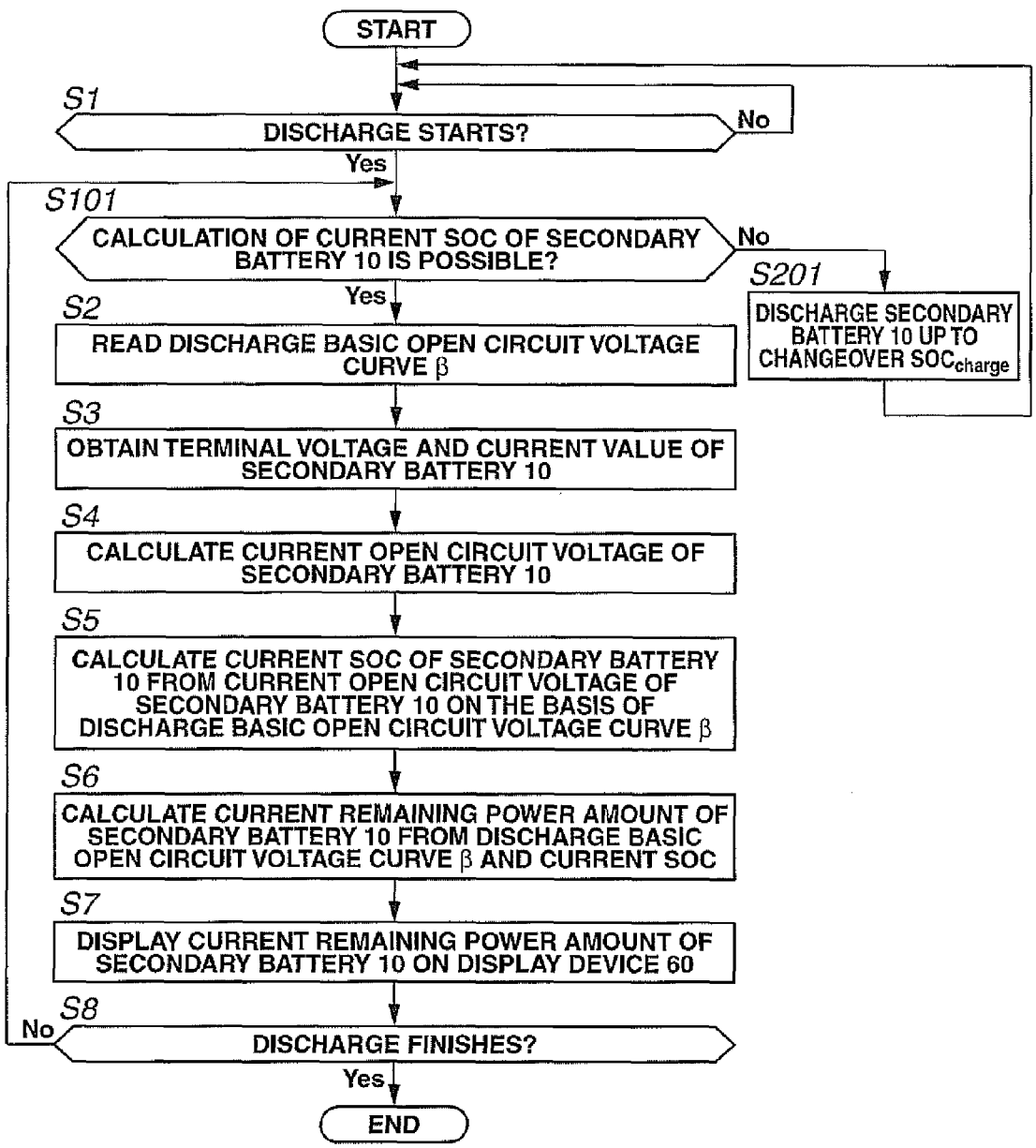
FIG. 11 is a flow chart showing a process executed in the control system of the secondary battery according to a third embodiment.

As shown in FIG. 11, when judged that the discharge of the secondary battery 10 from the fully charged state is started at step S1, the routine proceeds to step S101, then a judgment is made as to whether or not the calculation of the current SOC of the secondary battery 10 is possible.

When judged that the calculation of the current SOC of the secondary battery 10 is not possible at step S101, the routine proceeds to step S201. At step S201, a control to discharge the secondary battery 10 up to the changeover $SOC_{charge}$ that is the SOC at a time when changing the state from the discharge to the charge is carried out. When the secondary battery 10 is discharged up to the changeover $SOC_{charge}$, the routine returns to step S1.

On the other hand, when judged that the calculation of the current SOC of the secondary battery 10 is possible at step S101, the routine proceeds to step S2, then in the same manner as the second embodiment, processes of steps S2 to S8 are executed.

According to the third embodiment, in addition to the effects of the first embodiment, the following effect is obtained.

That is, according to the third embodiment, in the case where the calculation of the current SOC of the secondary battery 10 is impossible, by discharging the secondary battery 10 up to the changeover $SOC_{charge}$ that is the SOC at a time when changing the state from the discharge to the charge, the behavior of the open circuit voltage curve of the secondary battery 10 during the discharge can be fitted to the discharge basic open circuit voltage curve β again. With this operation, the calculation of the current SOC of the secondary battery 10 based on the discharge basic open circuit voltage curve β, which is explained in the first embodiment above, becomes possible. Accordingly, the calculation of the current SOC of the secondary battery 10 can be properly made.

Although the embodiments of the present invention has been explained above, the embodiments are described in order to facilitate an understanding of the present invention, and are not described to limit the present invention. Thus, each element or component disclosed in the above embodiments includes all design modifications and equivalents belonging to the technical scope of the present invention.

For instance, the above embodiments show the example in which, as the discharge basic open circuit voltage curve β when performing the discharge from the predetermined fully charged state, the open circuit voltage curve when performing the discharge from the fully charged voltage Vmax of SOC=100% is used. However, as the discharge basic open circuit voltage curve β, an open circuit voltage curve according to a battery design of the secondary battery 10 or a charge-discharge system design that actually uses the secondary battery 10 could be set. That is, for instance, it is not necessarily required that the predetermined fully charged state be set to an ideal fully charged state (this is a 100% charged state) that is considered from the positive electrode active material and the negative electrode active material forming the secondary battery 10. For example, a 95% charged state, which is slightly lower than the ideal fully charged state, could be set as the predetermined fully charged state. However, from the viewpoint of enhancing the effects of the present embodiments, it is desirable to set the predetermined fully charged state to a state that is close to the 100% charged state.

Further, in the present embodiments, instead of the discharge basic open circuit voltage curve β obtained by the actual measurement of data collected when actually charging the secondary battery 10 up to the predetermined fully charged voltage Vmax and afterwards actually discharging the secondary battery 10, intermittent data that is obtained by getting or sampling corresponding open circuit voltages at each certain SOC interval (e.g. at each 1% interval) from the data could be used as the discharge basic open circuit voltage curve β. By using such intermittent data, a data capacity in the controller 20 can be further reduced.

Figure 12:
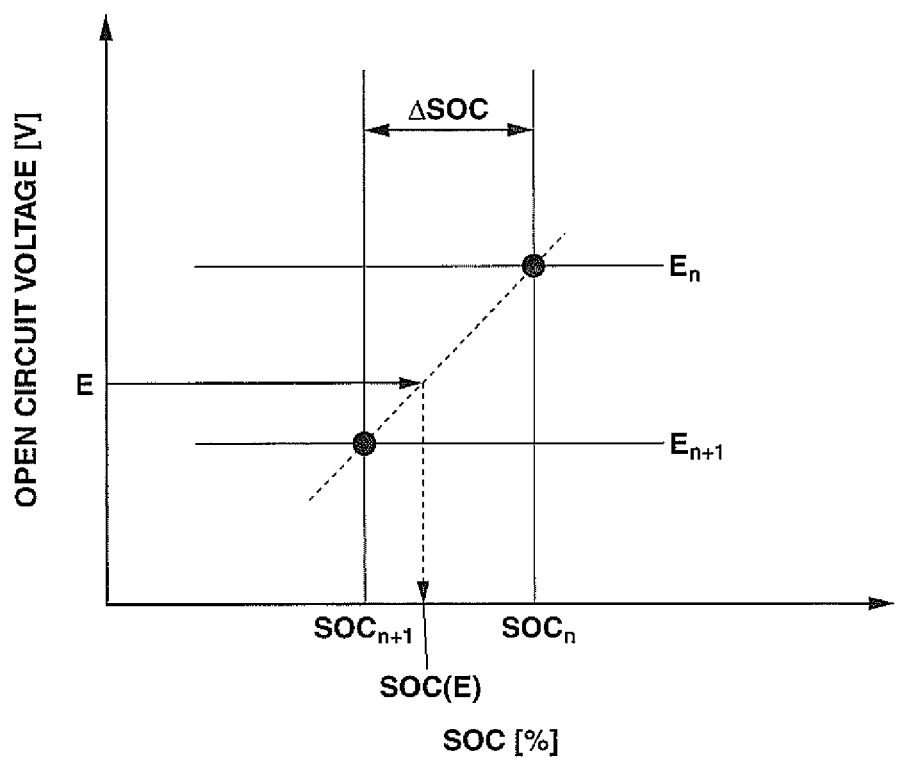
FIG. 12 is a drawing for explaining a method of calculating a current SOC of the secondary battery 10 according to the other embodiment.

In the case where the intermittent data is used, a method for determining the current SOC of the secondary battery 10 from the calculated open circuit voltages using an interpolation can be employed in the controller 20. That is, for instance, as shown in FIG. 12, in the intermittent data, a current open circuit voltage of the secondary battery 10 is E, an open circuit voltage whose corresponding SOC is stored and which has a value that is greater than the current open circuit voltage E of the secondary battery 10 is $E_n$, and an open circuit voltage whose corresponding SOC is stored and which has a value that is equal to or smaller than the current open circuit voltage E of the secondary battery 10 is $E_{n+1}$, then SOCs corresponding to these open circuit voltages $E_n$ and $E_{n+1}$ are $SOC_n$ and $SOC_{n+1}$. In this case, SOC (E) that is an SOC corresponding to the current open circuit voltage E of the secondary battery 10 can be calculated according to the following expression (4).

$$SOC(E) = SOC_n - \Delta SOC \times (E - E_n)/(E_{n+1} - E_n) \tag{4}$$

Here, in the expression (4), ΔSOC is a difference between the SOC corresponding to the open circuit voltage $E_n$ and the SOC corresponding to the open circuit voltage $E_{n+1}$. Further, in the case where the intermittent data is used, in order to increase a calculation accuracy of the SOC (E) of the SOC corresponding to the current open circuit voltage E of the secondary battery 10, it is preferable to select as the $E_n$ an open circuit voltage having a value that is greater than the current open circuit voltage E of the secondary battery 10 and is closest to the open circuit voltage E and to select as the $E_{n+1}$ an open circuit voltage having a value that is equal to or smaller than the current open circuit voltage E of the secondary battery 10 and is closest to the open circuit voltage E.

Or alternatively, in the case where the intermittent data is used, the SOC(E) of the SOC corresponding to the current open circuit voltage E of the secondary battery 10 might be calculated from the current open circuit voltage E of the secondary battery 10 according to a value of $(E-E_n)/(E_{n+1}-E_n)$ by the following expressions (5) and (6).

$$\text{If } 0 \le (E-E_n)/(E_{n+1}-E_n) < 0.5, SOC(E) = SOC_n \tag{5}$$

$$\text{If } 0 \le (E-E_n)/(E_{n+1}-E_n) < 1, SOC(E) = SOC_{n+1} \tag{6}$$

Here, in the expressions (5) and (6), $E_n$ is an open circuit voltage whose corresponding SOC is stored and which has a value that is greater than the current open circuit voltage E of the secondary battery 10 and is closest to the open circuit voltage E, and $E_{n+1}$ is an open circuit voltage whose corresponding SOC is stored and which has a value that is equal to or smaller than the current open circuit voltage E of the secondary battery 10 and is closest to the open circuit voltage E. Further, $SOC_{n+1}$ is an SOC that corresponds to the open circuit voltage $E_{n+1}$.

The above embodiments employ a method for determining the current SOC of the secondary battery 10 from the current open circuit voltage of the secondary battery 10 on the basis of the discharge basic open circuit voltage curve β. However, instead of this method, it is possible to calculate the current SOC of the secondary battery 10 on the basis of a current summation. That is, the charge-discharge current detected by the ammeter 40 from a discharge start time is continuously summed up, and on the basis of a summation result, the current SOC of the secondary battery 10 can be calculated. In this case, for instance, by making a calculation of the SOC by the current summation at a predetermined first interval (e.g. 10 m sec interval) and also by making a calculation of the SOC based on the above-mentioned discharge basic open circuit voltage curve β at a predetermined second interval (e.g. several minutes~ several tens of minutes) which is longer than the first interval, a calculation result of the SOC by the current summation can be corrected according to a calculation result of the SOC based on the discharge basic open circuit voltage curve β. By using this method in particular, while the calculation of the SOC is made by the current summation which has a relatively light operation load, the calculation result of the SOC by the current summation is corrected according to the calculation result of the SOC based on the discharge basic open circuit voltage curve β. This increases the calculation accuracy of the SOC.

Further, also in the case where the calculation of the SOC is made by the current summation, in the same manner as the above embodiments, it is possible to employ the configuration in which the remaining power amount and/or the remaining power ratio of the secondary battery 10 are calculated on the basis of the calculated current SOC of the secondary battery 10.

In the above embodiments, the secondary battery 10 corresponds to a secondary battery of the present invention, the controller 20 corresponds to a judging unit or means, a charge controlling unit or means, a discharge controlling unit or means, a storing unit or means, an SOC calculating unit or means, a remaining capacity calculating unit or means, a charge-discharge current summing unit or means and a correcting unit or means of the present invention.

The invention claimed is:

1. A control device of a secondary battery using, as a positive electrode material, a positive electrode active material that shows a difference of an open circuit voltage curve between during charge and discharge, comprising:
    a judging unit that judges, on the basis of a charge-discharge state of the secondary battery, whether or not calculation of a current state of charge (SOC) of the secondary battery is possible; and
    a charge controlling unit that, when it is judged that the calculation of the current SOC of the secondary battery is not possible by the judging unit, charges the secondary battery up to a predetermined fully charged state.

2. The control device of the secondary battery as claimed in claim 1, further comprising:
    a storing unit that stores, as basic discharge open circuit voltage information, a relationship between an SOC and an open circuit voltage in a discharge process of a case where the secondary battery is charged up to the predetermined fully charged state and afterwards the secondary battery is discharged from the fully charged state, and wherein
    when it is judged that the relationship between the SOC and the open circuit voltage of the secondary battery during the discharge of the secondary battery does not correspond to a basic discharge open circuit voltage curve that is obtained from the basic discharge open circuit voltage information, the judging unit judges that the calculation of the current SOC of the secondary battery is not possible.

3. The control device of the secondary battery as claimed in claim 1, wherein:
    when after the secondary battery is discharged, the charge of the secondary battery is performed again, the judging unit judges that the calculation of the current SOC of the secondary battery is not possible.

4. A control device of a secondary battery using, as a positive electrode material, a positive electrode active material that shows a difference of an open circuit voltage curve between during charge and discharge, comprising:
    a storing unit that stores, as basic discharge open circuit voltage information, a relationship between a state of charge (SOC) and an open circuit voltage in a discharge process of a case where the secondary battery is charged up to a predetermined fully charged state and afterwards the secondary battery is discharged from the fully charged state;
    an SOC calculating unit that calculates a current SOC of the secondary battery from a current open circuit voltage of the secondary battery in the discharge process on the basis of the basic discharge open circuit voltage information;
    a judging unit that judges, on the basis of the basic discharge open circuit voltage information, whether or not calculation of the current SOC of the secondary battery by the SOC calculating unit is possible; and
    a charge controlling unit that, when it is judged that the calculation of the current SOC of the secondary battery is not possible by the judging unit, charges the secondary battery up to the predetermined fully charged state.

5. The control device of the secondary battery as claimed in claim 4, further comprising:
    a remaining capacity calculating unit that calculates a remaining capacity of the secondary battery from the current SOC of the secondary battery calculated by the SOC calculating unit.

6. The control device of the secondary battery as claimed in claim 5, wherein:
    the remaining capacity calculating unit calculates the remaining capacity of the secondary battery as a remaining power amount of the secondary battery on the basis of the basic discharge open circuit voltage information and the current SOC of the secondary battery.

7. The control device of the secondary battery as claimed in claim 4, wherein:
    the storing unit stores, as the basic discharge open circuit voltage information, the relationship between the SOC and the open circuit voltage in the discharge process intermittently at each predetermined SOC interval, and
    the SOC calculating unit calculates the current SOC of the secondary battery from the current open circuit voltage of the secondary battery according to a following expression (I);

$$SOC(E) = SOC_n - \Delta SOC \times (E - E_n)/(E_{n+1} - E_n) \tag{I}$$

in the expression (I),
E is the current open circuit voltage of the secondary battery,
$E_n$ is an open circuit voltage whose corresponding SOC is stored in the storing unit and which has a value that is greater than the current open circuit voltage E of the secondary battery,
$E_{n+1}$ is an open circuit voltage whose corresponding SOC is stored in the storing unit and which has a value that is equal to or smaller than the current open circuit voltage E of the secondary battery,
$SOC_n$ is an SOC corresponding to the open circuit voltage $E_n$,
$\Delta SOC$ is a difference between the SOC corresponding to the open circuit voltage $E_n$ and the SOC corresponding to the open circuit voltage $E_{n+1}$, and
SOC(E) is an SOC corresponding to the current open circuit voltage E of the secondary battery.

8. The control device of the secondary battery as claimed in claim 4, wherein:
    the positive electrode active material contains a compound expressed by a following general expression (II)

$$a\text{Li}[\text{Li}_{1/3}\text{Mn}_{2/3}]\text{O}_2 \cdot (1-a)\text{Li}[\text{Ni}_w\text{Co}_x\text{Mn}_y\text{A}_z]\text{O}_2 \tag{II}$$

in the expression (II),
$0 < a < 1$, $w+x+y+z=1$, $0 \leq w$, $x$, $y$, $z \leq 1$, A is metallic element.

9. The control device of the secondary battery as claimed in claim 4, further comprising:
    a charge-discharge current summing unit that calculates an SOC based on a current summation by summing up a charge-discharge current of the secondary battery, and wherein the charge-discharge current summing unit is provided with a correcting unit that, on the basis of the current SOC of the secondary battery calculated by the SOC calculating unit, corrects the SOC based on the current summation calculated by the charge-discharge current summing unit.

10. A control device of a secondary battery using, as a positive electrode material, a positive electrode active material that shows a difference of an open circuit voltage curve between during charge and discharge, comprising:
   a storing unit that stores, as basic discharge open circuit voltage information, a relationship between a state of charge (SOC) and an open circuit voltage in a discharge process of a case where the secondary battery is charged up to a predetermined fully charged state and afterwards the secondary battery is discharged from the fully charged state;
   an SOC calculating unit that calculates a current SOC of the secondary battery from a current open circuit voltage of the secondary battery in the discharge process on the basis of the basic discharge open circuit voltage information;
   a judging unit that judges, on the basis of the basic discharge open circuit voltage information, whether or not calculation of the current SOC of the secondary battery by the SOC calculating unit is possible; and
   a discharge controlling unit that, when it is judged that the calculation of the current SOC of the secondary battery is not possible by the judging unit, discharges the secondary battery until the calculation of the current SOC of the secondary battery becomes possible on the basis of the basic discharge open circuit voltage information.

11. The control device of the secondary battery as claimed in claim 10, further comprising:
   a remaining capacity calculating unit that calculates a remaining capacity of the secondary battery from the current SOC of the secondary battery calculated by the SOC calculating unit.

12. The control device of the secondary battery as claimed in claim 11, wherein:
   the remaining capacity calculating unit calculates the remaining capacity of the secondary battery as a remaining power amount of the secondary battery on the basis of the basic discharge open circuit voltage information and the current SOC of the secondary battery.

13. The control device of the secondary battery as claimed in claim 10, wherein:
   the storing unit stores, as the basic discharge open circuit voltage information, the relationship between the SOC and the open circuit voltage in the discharge process intermittently at each predetermined SOC interval, and
   the SOC calculating unit calculates the current SOC of the secondary battery from the current open circuit voltage of the secondary battery according to a following expression (I);

$$SOC(E) = SOC_n - \Delta SOC \times (E - E_n)/(E_{n+1} - E_n) \quad (I)$$

in the expression (I),
E is the current open circuit voltage of the secondary battery,
$E_n$ is an open circuit voltage whose corresponding SOC is stored in the storing unit and which has a value that is greater than the current open circuit voltage E of the secondary battery,
$E_{n+1}$ is an open circuit voltage whose corresponding SOC is stored in the storing unit and which has a value that is equal to or smaller than the current open circuit voltage E of the secondary battery,
$SOC_n$ is an SOC corresponding to the open circuit voltage $E_n$,
$\Delta SOC$ is a difference between the SOC corresponding to the open circuit voltage $E_n$ and the SOC corresponding to the open circuit voltage $E_{n+1}$, and
SOC(E) is an SOC corresponding to the current open circuit voltage E of the secondary battery.

14. The control device of the secondary battery as claimed in claim 10, wherein:
   the positive electrode active material contains a compound expressed by a following general expression (II)

$$a\text{Li}[\text{Li}_{1/3}\text{Mn}_{2/3}]\text{O}_2 \cdot (1-a)\text{Li}[\text{Ni}_w\text{Co}_x\text{Mn}_y\text{A}_z]\text{O}_2 \quad (II)$$

in the expression (II),
$0 < a < 1$, $w+x+y+z=1$, $0 \le w, x, y, z \le 1$, A is metallic element.

15. The control device of the secondary battery as claimed in claim 10, further comprising:
   a charge-discharge current summing unit that calculates an SOC based on a current summation by summing up a charge-discharge current of the secondary battery, and wherein
   the charge-discharge current summing unit is provided with a correcting unit that, on the basis of the current SOC of the secondary battery calculated by the SOC calculating unit, corrects the SOC based on the current summation calculated by the charge-discharge current summing unit.

16. A charging control method of a secondary battery using, as a positive electrode material, a positive electrode active material that shows a difference of an open circuit voltage curve between during charge and discharge, the charging control method comprising:
   judging by a controller, on the basis of a charge-discharge state of the secondary battery, whether or not calculation of a current state of charge (SOC) of the secondary battery is possible; and
   when it is judged that the calculation of the current SOC of the secondary battery is not possible, charging under control of a controller, the secondary battery up to a predetermined fully charged state.

17. A state of charge (SOC) detection method of a secondary battery using, as a positive electrode material, a positive electrode active material that shows a difference of an open circuit voltage curve between during charge and discharge, the SOC detection method comprising:
   judging by a controller, on the basis of a charge-discharge state of the secondary battery, whether or not calculation of a current SOC of the secondary battery is possible; and
   when it is judged that the calculation of the current SOC of the secondary battery is not possible, calculating under control of a controller, the current SOC of the secondary battery on the basis of a relationship between an SOC and an open circuit voltage in a discharge process of a case where the secondary battery is charged up to a predetermined fully charged state and afterwards the secondary battery is discharged from the fully charged state and a current open circuit voltage of the secondary battery.

* * * * *